US005717896A

United States Patent [19]
Yung et al.

[11] Patent Number: 5,717,896
[45] Date of Patent: Feb. 10, 1998

[54] METHOD AND APPARATUS FOR PERFORMING PIPELINE STORE INSTRUCTIONS USING A SINGLE CACHE ACCESS PIPESTAGE

[75] Inventors: Robert Yung, Fremont; Guillermo Maturana, Berkeley, both of Calif.

[73] Assignee: Sun Microsystems, Inc., Mountain View, Calif.

[21] Appl. No.: 667,182

[22] Filed: Jun. 20, 1996

Related U.S. Application Data

[63] Continuation of Ser. No. 208,987, Mar. 9, 1994, abandoned.

[51] Int. Cl.⁶ .................................................. G06F 12/08
[52] U.S. Cl. ........................ 395/467; 395/403; 395/381
[58] Field of Search .............................. 395/467, 381, 395/496, 395, 506, 403, 452, 453, 450, 872

[56] References Cited

U.S. PATENT DOCUMENTS

| | | | |
|---|---|---|---|
| 4,493,033 | 1/1985 | Ziegler et al. | 395/467 |
| 4,695,943 | 9/1987 | Keeley et al. | 395/467 |
| 4,855,904 | 8/1989 | Daberkow et al. | 395/467 |
| 5,073,851 | 12/1991 | Masterson et al. | 395/467 |
| 5,148,536 | 9/1992 | Witek et al. | 395/467 |
| 5,163,142 | 11/1992 | Mageau | 395/467 |
| 5,222,223 | 6/1993 | Webb, Jr. et al. | 395/467 |
| 5,285,323 | 2/1994 | Hetherington et al. | 395/449 |
| 5,297,281 | 3/1994 | Emma et al. | 395/392 |
| 5,307,477 | 4/1994 | Taylor et al. | 395/403 |
| 5,386,526 | 1/1995 | Mitra et al. | 395/403 |
| 5,430,888 | 7/1995 | Witek et al. | 395/800 |
| 5,497,470 | 3/1996 | Liencres | 395/467 |

FOREIGN PATENT DOCUMENTS

| | | |
|---|---|---|
| 0 398 382 A2 | 11/1990 | European Pat. Off. . |
| 0 442 690 A2 | 8/1991 | European Pat. Off. . |
| 62067649 | 3/1987 | Japan . |
| 63-206843 | 8/1988 | Japan . |
| WO87/04823 | 8/1987 | WIPO . |

OTHER PUBLICATIONS

Bursky, Highly Integrated cache-tag RAMs perform matches in 12 ns, Electronic Design, vol. 40, No. 7, p. 114(1), Apr. 2, 1992.

Blount et al., Deferred Cache Storing Method, IBM Technical Disclosure Bulletin, vol. 23, No. 1, pp. 262–263, Jun. 1980.

*Primary Examiner*—Matthew M. Kim
*Attorney, Agent, or Firm*—Blakely Sokoloff Taylor & Zafman

[57] ABSTRACT

A mechanism for implementing a store instruction so that a single cache access stage is required. Since a load instruction requires a single cache access stage, in which a cache read occur, both the store and load instructions of the present invention utilize a uniform number of cache access stages. The store instruction is implemented in a pipeline microprocessor such that during the pipeline stages of a given store instruction, the cache memory is read and there is an immediate determination if there is a tag hit for the store. Assuming there is cache hit, the cache write associated with the given store instruction is implemented during the same pipeline stage as the cache access stage of a subsequent instruction that does not write to the cache or if there is no instruction. For example, a cache data write occurs for the given store simultaneously with the cache tag read of a subsequent store instruction. This allows for a more uniform and efficient pipeline format for each instruction. During the period in which a given store is delayed, its data is placed into a store buffer. On a cache miss, when a data line returns from memory, the store buffer locates a free period of the cache and stores the data. The store mechanism is implemented in a pipeline processor and also with a general purpose computer system.

32 Claims, 11 Drawing Sheets

| | 0 | 1 | 2 | 3 | 4 | 5 | 6 | 7 | 8 | |
|---|---|---|---|---|---|---|---|---|---|---|
| | | | (STAGES) | | | | | | | |
| STORE | F | D | X | $C_r$ | $C_w$ | W | | | | VALID 15 |
| LOAD$_0$ | | F | D | X | $C_r$ | $C_w$ | W | | | IMPERMISSIBLE 17 |
| LOAD$_0$ | | F | D | X | →STALL | $C_r$ | $C_w$ | W | | VALID 19 |
| LOAD$_1$ | | | F | D | →STALL | X | $C_r$ | $C_w$ | W | VALID 21 |

FIGURE 1C

METHOD AND APPARATUS FOR PERFORMING PIPELINE STORE INSTRUCTIONS USING A SINGLE CACHE ACCESS PIPESTAGE

This is a continuation of application Ser. No. 08/208,987 filed Mar. 9, 1994 now abandoned.

BACKGROUND OF THE INVENTION

(1) Field of the Invention

The present invention relates to the field of computer processors and specifically to efficient processing of store instructions. More particularly, the present invention relates to the field of reducing the time required for a processor to execute the pipeline stages for a store instruction.

(2) Art Background

Microprocessors of the art background execute load and store instructions from an instruction sequence. Load instructions cause the microprocessor to request that certain data be supplied from memory and store instructions cause the microprocessor to write certain data to memory. Memory can be divided into differing levels of hierarchy with separate levels of small high speed cache memory and larger, but slower, levels of main memory. Information required for load and store instructions not present within the targeted cache memory must be retrieved from alternate memory outside of the targeted cache. Once retrieved from the alternate memory, the cache is often updated with the data. The utilization of memory hierarchies composed of cache levels and main memory is well known in the art.

In pipeline microprocessors, execution of instructions, including load and store instructions, are often broken down into separate pipeline stages or "pipestages." Generally, all instructions have to pass through each stage of the pipeline. Pipeline microprocessors are more efficient, over non-pipeline microprocessors, because different stages of different instructions may be executed simultaneously in a well known manner. As will be illustrated, exemplary pipestages are simplified to facilitate teachings of the present invention.

However, because all instructions are forced to adopt the same pipeline stages, processing inefficiencies result in prior art microprocessor designs. For instance, FIG. 1A illustrates some of the conventional stages (including all the cache access stages) of a prior art load instruction. With respect to the load instruction, there is an address generation stage "AG" 10a followed by a cache access stage 10b in which the cache is read to retrieve the tag and data of the memory location to be loaded. The tag value determines whether the data present in the cache corresponds to the address requested. Starting at stage 10c, the data can be used for processing by the processor according to a program. As is typical among load instructions, the tag and data are read concurrently from the cache in a single stage.

FIG. 1B illustrates some of the stages 12a–12e of a typical store instruction of the prior art. Similar to the load instruction there is an address generation stage 12a. Next, at stage 12b, the cache is accessed and the tag information is read from the cache in order to locate a tag match within the cache. Several types of cache implementations are possible, including well known types such as write-through, write-back, allocate and non-allocate. A combination of these policies requires that tag checking be performed before the cache is updated. At stage 12c, the tag information is checked to determine if there is a cache hit. If the tag of the memory location of the store data is present within the cache, then there is a tag hit and at stage 12d another cache access stage is required wherein the data of the store instruction is written into the cache memory. It is appreciated that with reference to the load and store examples above, upon a cache miss, the execution unit of the microprocessor must access additional memory sources (through a number of cache levels) until a cache hit occurs or until main memory is accessed. This process adds to the stages required to process a store or load instruction.

As demonstrated from the above, in the typical pipeline structure of the prior art, the load instruction requires one cache access stage while the store instruction requires two cache access stages (e.g., a tag read followed by a data write). Within a pipeline processor, it would be advantageous to minimize the number of stages in which each instruction needs to access the cache. This is because in high performance microprocessors memory requests can be a source of throughput degradation and bandwidth limitations by causing a data bottleneck, particularly with a single port cache. It would be advantageous to reduce the number of cache access stages required for a store instruction.

FIG. 1C illustrates the advantage of having a uniform pipeline structure for all instructions. Assume that in a given simplified prior an microprocessor pipeline structure, two cache access cycles (a read cycle followed by a write cycle) are devoted for each instruction. This is done partly because the store instruction of the prior art require's two cache access cycles. Assume also that each instruction is divided into 6 separate instruction stages: an instruction fetch stage (F), an instruction decode stage (D), an execution stage (X), a cache read (Cr) stage, a cache write (Cw) stage, and finally a register write stage (W).

Pipeline stages 15 and 17 of FIG. 1C illustrate that within this pipeline format, a load instruction (load0) may not immediately follow a store instruction (e.g., the instructions may not be processed back-to-back) because their cache access stages will conflict at cycle 4. For instance, at pipeline cycle 4 the cache write (Cw) stage of the store pipeline 15 occurs at the same time as the cache read (Cr) stage of the load pipeline 17. Unless more complex and expensive caches are employed, the read and write to the cache cannot be processed in the same stage, hence the pipeline 17 is impermissible.

One way to overcome the cache access conflict is to stall the load0 instruction at stage 4 so that it occurs one pipeline stage later than load pipeline 17. Load0 pipeline 19 illustrates the result with the load0 instruction shifted in time by one clock cycle at stage 4 so that its cache read and write stages do not conflict with any of the cache read and write stages of the store pipeline 15. This requires that any load following a store be stalled, which results in a degradation of performance for the microprocessor. According to the load pipeline 19, the cache read stage does not begin until cycle 4 which is after all the cache access stages of the store pipeline 15 have completed. However, this solution is not the most advantageous because it reduces the performance of the microprocessor. Further, by stalling the load0 pipeline, a subsequent instruction (such as load1 at pipeline 21) is also stalled at stage 4.

Pipeline formats must be efficiently designed to account for all instructions within a given processor architecture. As such, the pipeline format must be designed to accommodate instructions that require the most stages. It would be advantageous then to provide a uniform pipeline format without having the performance degradation as shown above.

Store buffers are present in prior art processor architectures and act as a temporary memory locations for holding data pertaining to store instructions. Instructions following a store instruction typically will not utilize the data associated with the store instruction. Therefore, it is advantageous to be able to place a given store instruction into a store buffer, and then, before the store instruction is executed, execute a subsequent instruction that does not depend on the data of the store instruction. The store buffer, often implemented in a first-in, first-out (FIFO) configuration, contains the required logic to execute the store instruction out-of-order and update any cache memories, if necessary. In this way, the store buffer acts to make processors more efficient. It would be advantageous to utilize a store buffer to make pipeline execution within a processor more efficient and to solve the problems as discussed above.

SUMMARY OF THE INVENTION

The present invention provides the advantage of reducing the number of cache access stages required for a store instruction and also provides the advantage of reducing the number of cache access stages in an instruction pipeline format. The present invention provides the advantage of a uniform instruction pipeline format without having performance degradation and also offers the advantage of utilizing a store buffer to make pipeline execution within a processor more efficient.

The present invention includes embodiments including a mechanism for performing a pipeline store instruction requiring a single cache access pipestage, the mechanism including: a cache unit for storing data information and tag information; pipeline processing circuitry for processing a store instruction, the pipeline processing circuitry for performing a tag read during a single cache access pipestage associated with an instruction pipeline of the store instruction; store logic for writing data information associated with the store instruction into a store buffer for temporarily buffering the data information; and write logic for performing a data write operation for the data information associated with the store instruction, the data write operation for writing the data information to the cache unit within a clock cycle wherein the data information of the cache unit is not otherwise accessed. The present invention includes the above and wherein the cache unit comprises: a first memory portion having a first decoder for addressing the first memory portion, wherein the first memory portion is for containing the tag information; and a second memory portion having a second decoder for addressing the second memory portion, wherein the second memory portion is for containing the data information.

The present invention includes the above and wherein the clock cycle wherein the data information of the cache unit is not otherwise accessed is a free cache access pipestage of a subsequent instruction and wherein the subsequent instruction is a subsequent store instruction and wherein the write logic is coupled to the store buffer for obtaining the data information of the store instruction.

The present invention also includes a method of performing the delayed store mechanism in accordance with the above as well as an improved processor and improved general purpose computer system, with both processor and system implemented with the delayed store mechanism and method of the present invention.

BRIEF DESCRIPTION OF THE DRAWINGS

FIG. 1C illustrates cache access conflicts resultant from back to back execution a store and load instruction.

DETAILED DESCRIPTION OF THE INVENTION

Overall System Operation

Figure 1A:
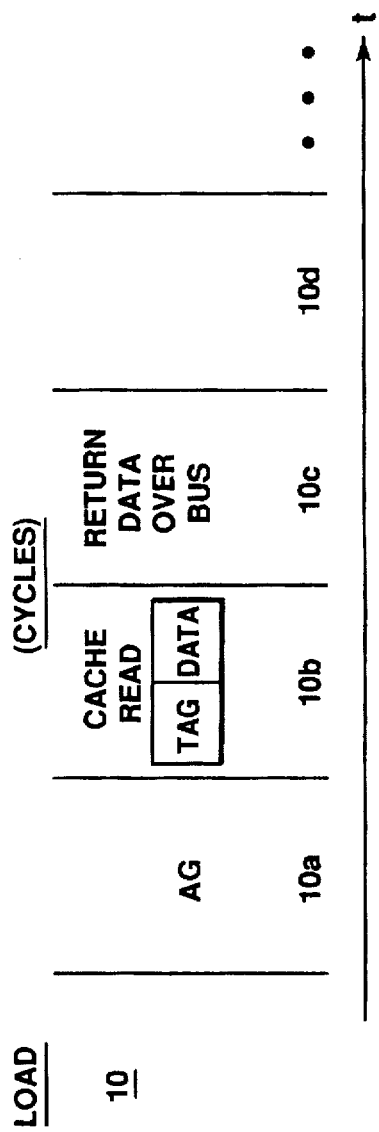
FIG. 1A illustrates the cache access stages of a load instruction of the prior art.

In the following detailed description of the present invention numerous specific details are set forth in order to provide a thorough understanding of the present invention. However, it will be obvious to one skilled in the art that the present invention may be practiced without these specific details. In other instances well known methods, procedures, components, and circuits have not been described in detail as to not unnecessarily obscure aspects of the present invention.

The present invention includes an apparatus and method for providing a delayed store instruction wherein the data write information for a given store instruction may be delayed to occur during a cache access stage of a subsequent instruction that does not write or read the cache memory. In a particular embodiment, the subsequent instruction is a subsequent store instruction and for a given cache access stage of a given store instruction: (1) a cache tag read occurs for that given instruction and also (2) a cache data write may occur that was delayed and is associated with a previously decoded store instruction. In the present invention, during the cache tag read cycle, there is available hardware to also perform a cache data write operation at the same time, by providing separate decoding logic is provided within the cache unit to separate the tag and data accesses. By allowing the delayed cache data write operation to occur in the pipeline stages of a subsequent store operation, it becomes, in effect, "delayed." Therefore the terminology "delayed store" is adopted herein to represent an aspect of the present invention which splits the cache tag read and cache data write operations of a store instruction into separate pipelines and effectively "delays" the cache data write operation, for a given store instruction, until a subsequent store operation is processed.

By allowing the cache data write operation (of a previous store instruction) to occur at the same time as the cache tag read operation (of a current store instruction), the present invention advantageously eliminates one of the required pipeline stages of the prior art store instruction such that, under the present invention, a store instruction requires only a single cache access pipeline stage. Further, since the load instruction similarly requires only one cache access stage, the store instruction of the present invention and the load instruction have uniform pipeline formats regarding their cache access stages. This pipeline stage uniformity provides for more efficient processing of instructions by the processor. Because a cache is effective only if it has a high hit rate, it is advantageous to optimize cache hit operations. Before the delayed cache write operation is performed for a given store instruction, the pertinent information associated with the store instruction is loaded into a store buffer. The store buffer as used in conjunction with the present invention will be described in detail to follow.

It is appreciated that, for a given store instruction, if there is a cache miss, then the cache write operation associated with the given store instruction may not be implemented in conjunction with a subsequent store instruction, as discussed above because a tag write must also be done for the given store. The present invention, in these cases, will perform the required cache write operation during a free cache access stage. This free cache access stage may be associated with a subsequent instruction that does not access the cache or, alternatively, may be made available upon stalling the execution unit of the processor. It is appreciated, as will be discussed below, that upon a cache miss for a given store instruction, its cache write operation may not occur during a cache (tag) read operation of a subsequent store instruction because upon a cache miss, the cache write operation needs to write a new tag in addition to the data. Accordingly, the tag read (of the subsequent store instruction) and a tag write (of the given store instruction) create an undesired conflict.

Figure 1B:
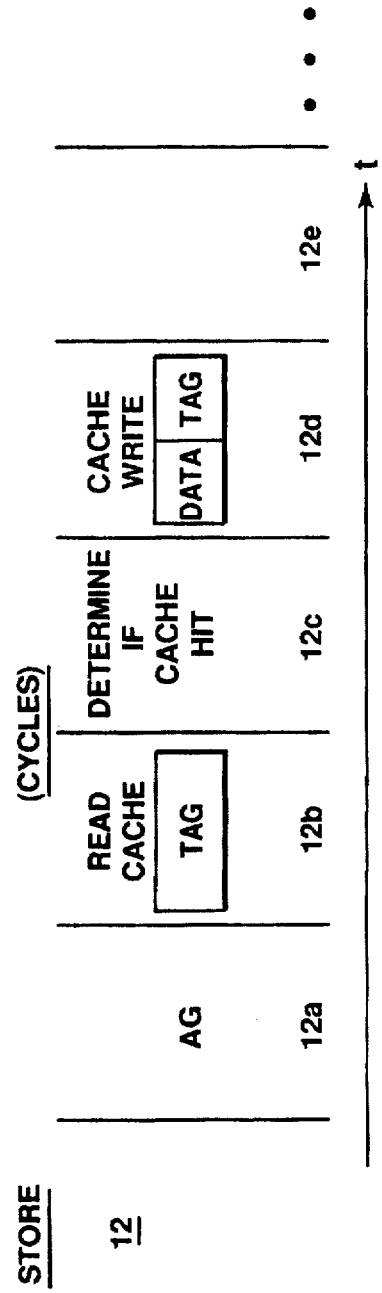
FIG. 1B illustrates the cache access stages of a store instruction of the prior art.

Refer to FIG. 1A of the prior art. As shown in pipeline 10, at stage 10b, a load instruction performs a tag read operation and a data read operation from the cache during the cache access stage. However, as illustrated in pipeline 12, stage 12b of FIG. 1B, this cache access cycle performs only a cache tag read operation. The present invention delayed store mechanism performs both a cache tag read operation and a cache tag write operation (of a previous store instruction) during stage 12b and also eliminates stage 12d of the prior art. Upon a cache hit associated with a store instruction, the present invention does not perform a tag write operation (because the tag is already present) and performs the required cache data write operation during a pipeline stage of a subsequent store instruction. The cache write operation is performed while that subsequent store instruction performs its cache tag read operation. During the delay period, before the cache data write operates takes place, the store instruction is placed into a store buffer.

As discussed above, regarding the data dependencies of subsequent instruction to a load or store instruction, store instructions generally are not as critical and a subsequent load instruction may need to check the store buffer for the most recently modified data. Therefore, in the general case, instructions subsequent to a given store instruction may be executed in advance of the given store instruction. During the period before the store instruction is eventually executed, it is placed into a store buffer which may be configured as a FIFO. Using a store buffer, processors can execute store instructions out-of-order. The preferred embodiment of the present invention utilizes a store buffer to implement the delayed store mechanism as described herein.

Description of the Operation of the Present Invention

Figure 2A:
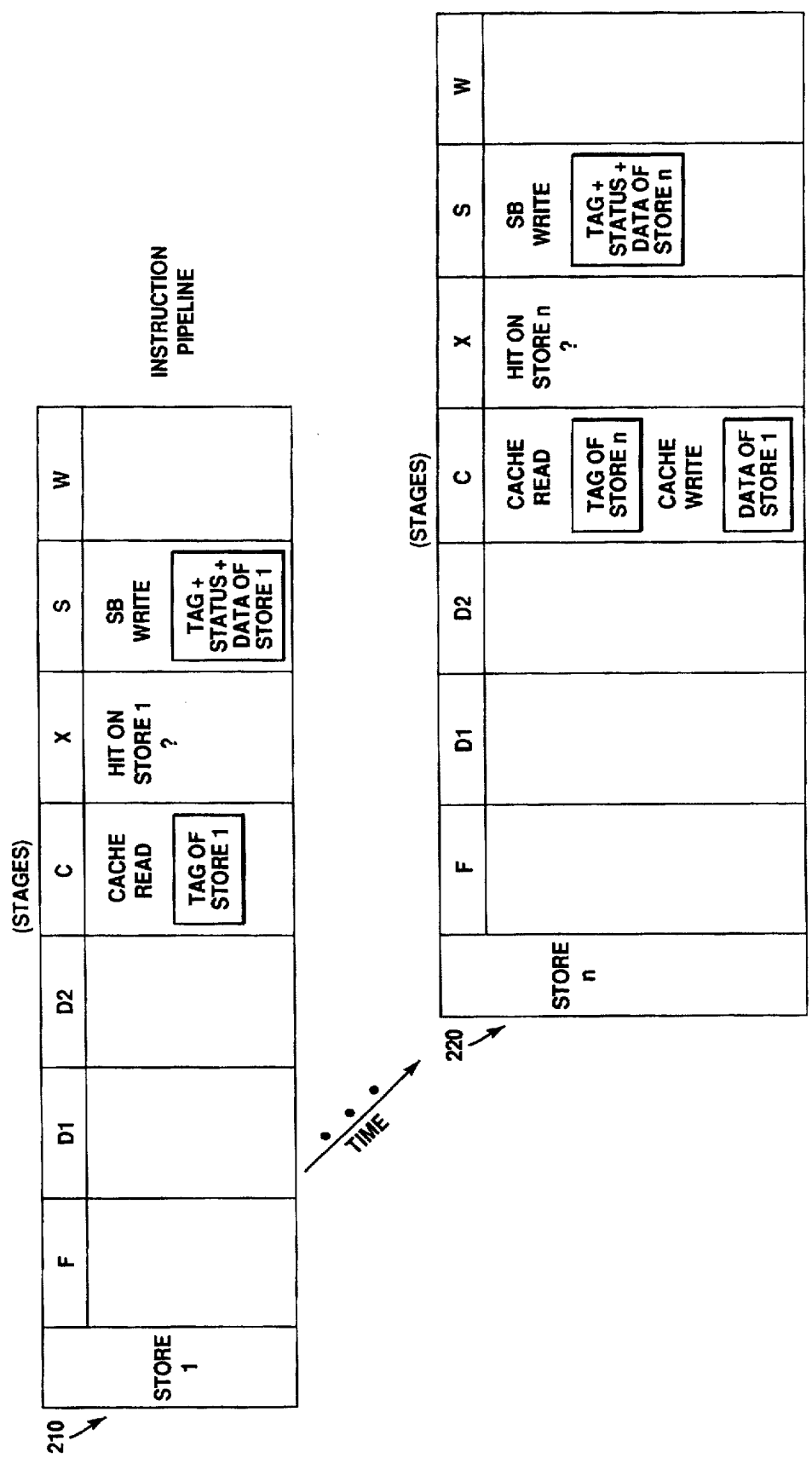
FIG. 2A is a pipeline chart and illustrates the novel delayed store mechanism of the present invention utilizing the C stage of a subsequent store instruction.

With reference to FIG. 2A, two instruction pipelines are illustrated representing an exemplary pipeline format adopted to facilitate discussion of the present invention. It is appreciated that the pipeline format, composed of individual stages, shown in FIG. 2A is exemplary only and that a number of various pipeline formats may be utilized within the scope of the delayed store mechanism of the present invention. The important pipestage being the cache access pipestage. Any number of pipestage formats may be adopted by the present invention that contain a cache access pipestage.

Figure 8:
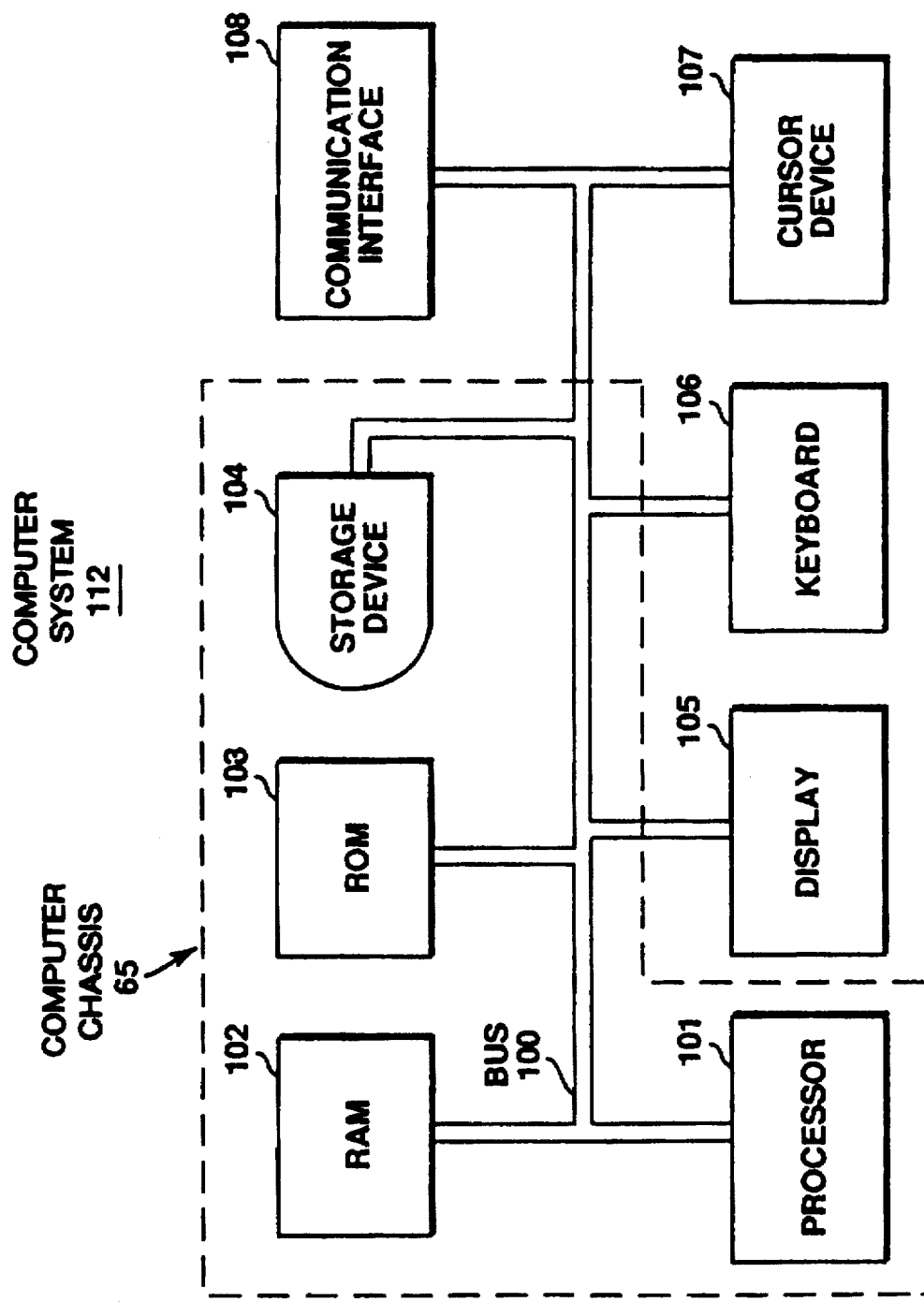
FIG. 8 is a functional block diagram of an improved general purpose computer system of the present invention implemented with the pipeline processor of the present invention.

By way of illustration, the pipeline format shown comprises 7 stages labeled: F, D1, D2, C, X, S, and W. The F stage fetches the instruction. The D1 and D2 stages are the instruction decode stages. At the C stage the cache is accessed. The X and S stages are additional execution stages and regarding the load and store instruction of the present invention the cache hit determination (examination) is performed at the X stage. At the S stage, information is written to the store buffer. At the W stage, instruction information is written back to the processor's register file (see FIG. 8). According to the present invention, the load and store instructions will access the cache memory during the C stage of the pipeline. It is appreciated that alternate pipeline stages could be adopted within the scope of the present invention that utilize more or fewer execution stages or that have multiple address generation and/or decode stages. Further, other stages as shown above could be eliminated totally. The present invention does, however, provide a uniform number of cache access stages for both load and store instructions. As shown, all cache accessing for loads and stores is performed at stage C.

Figure 2B:
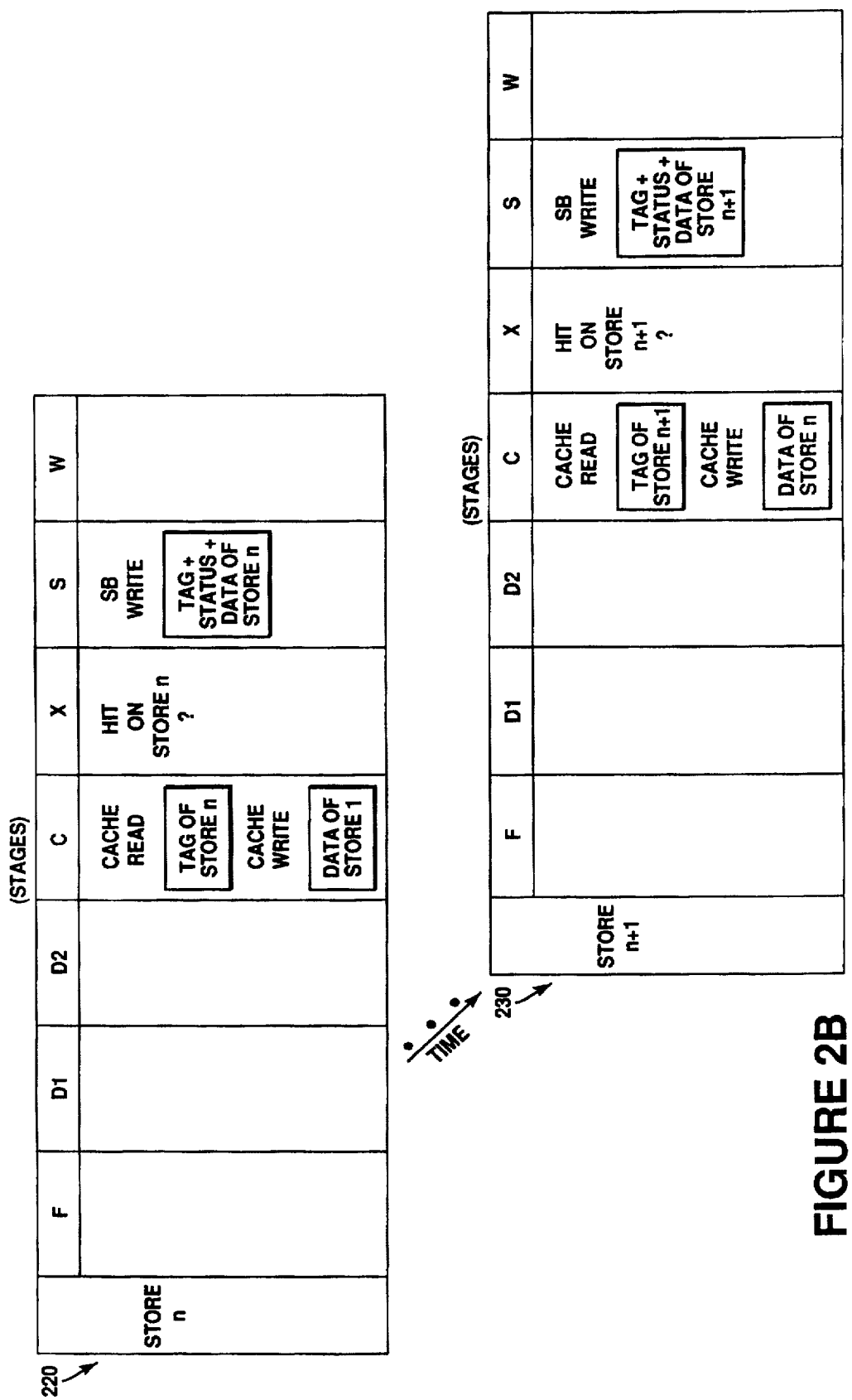
FIG. 2B is a pipeline chart and illustrates the novel delayed store mechanism of the present invention.

FIG. 2A and FIG. 2B illustrate exemplary pipeline stages for three store instructions that do not necessarily occur back-to-back, but do occur in a particular order to illustrate the delayed store mechanism of the present invention. For example, store 1 (pipeline 210) is decoded before store n (pipeline 220) which occurs before store n+1(pipeline 230 of FIG. 2B). For illustration of the delayed store aspects of the present invention, it is assumed that store 1 is the first store instruction processed by the present invention after initialization and no previous store instructions exist. An exemplary instruction code sequence is shown below in order of execution where * * * represents other, arbitrary, instructions. The memory locations y, z and k correspond to store 1, store n, and store n+1 as shown.

Store 1 Store data from register to memory location y
Store n Store data from register to memory location z
Store n+1 Store data from register to memory location k As shown in pipeline 210 of FIG. 2A, the store 1 instruction is fetched and decoded at stages F, D1 and D2, respectively. At stage C, a cache read of the address tag associated with memory location y is performed. Since store 1 is the first store instruction, no other operation is performed at stage C. At stage X, a determination is made by the processor if the tag associated with memory location y is present within the cache. If it is present, the address within the cache containing the tag is recorded. At location S of pipeline 210, the cache address associated with the tag, the tag, the status, and the data associated with store 1 are all written into the store buffer.

At pipeline stage 220 of FIG. 2A the second store, store n, is processed by the present invention. This instruction is fetched and decoded at stages F, D1, and D2, respectively. At stage C, the present invention performs two functions assuming the tag of store 1 found a tag hit in stage X of pipeline 210. First, the cache tags are read for store n and second, the data associated with store 1 is written from the store buffer into the cache. The store buffer contains the data for store 1 until the next C stage of a subsequent store instruction, which in this case is store n. At stage X, a determination is made if the tags read from stage C of pipeline 220 match for memory location z. If there is a match within the cache, the address of the cache that matched will be recorded. At stage S, similar to pipeline 210, the tag, cache address of the tag, status and data of store n are all recorded into the store buffer. As seen from the above, store 1 was delayed in that its associated cache write operation of its data was delayed until the C stage of pipeline 220. In this example, the data of store 1 was written to the cache during stage C of pipeline 220 which occurs at the same instant as stage W of pipeline 210.

FIG. 2B illustrates the instruction pipeline 220 of store n in relation to the instruction pipeline 230 for store n+1. The store n+1 instruction is fetched and decoded at stages F, D1, and D2, respectively. At stage C of pipeline 230, the present invention performs two functions assuming the hit determination of stage X of pipeline 220 located a tag match. First, the cache tags are read for store n+1 and second, the data associated with store n is written from the store buffer into the cache. The store buffer contains the data for store n until the next C stage of a subsequent store instruction, which in this case is store n+1. At stage X, a determination is made if the tags read from stage C of pipeline 230 match for memory location k. If there is a match within the cache, the address of the cache that matched will be recorded. At stage S, similar to pipeline 220, the tag, cache address of the tag, status and data of store n+1 are all recorded into the store buffer. As seen from the above, store n was delayed in that the cache write operation of the data was delayed until the C stage of pipeline 230. In this example, the data of store n was written to the cache during stage C of pipeline 230 which occurs at the same instant as stage W of pipeline 220.

Figure 2C:
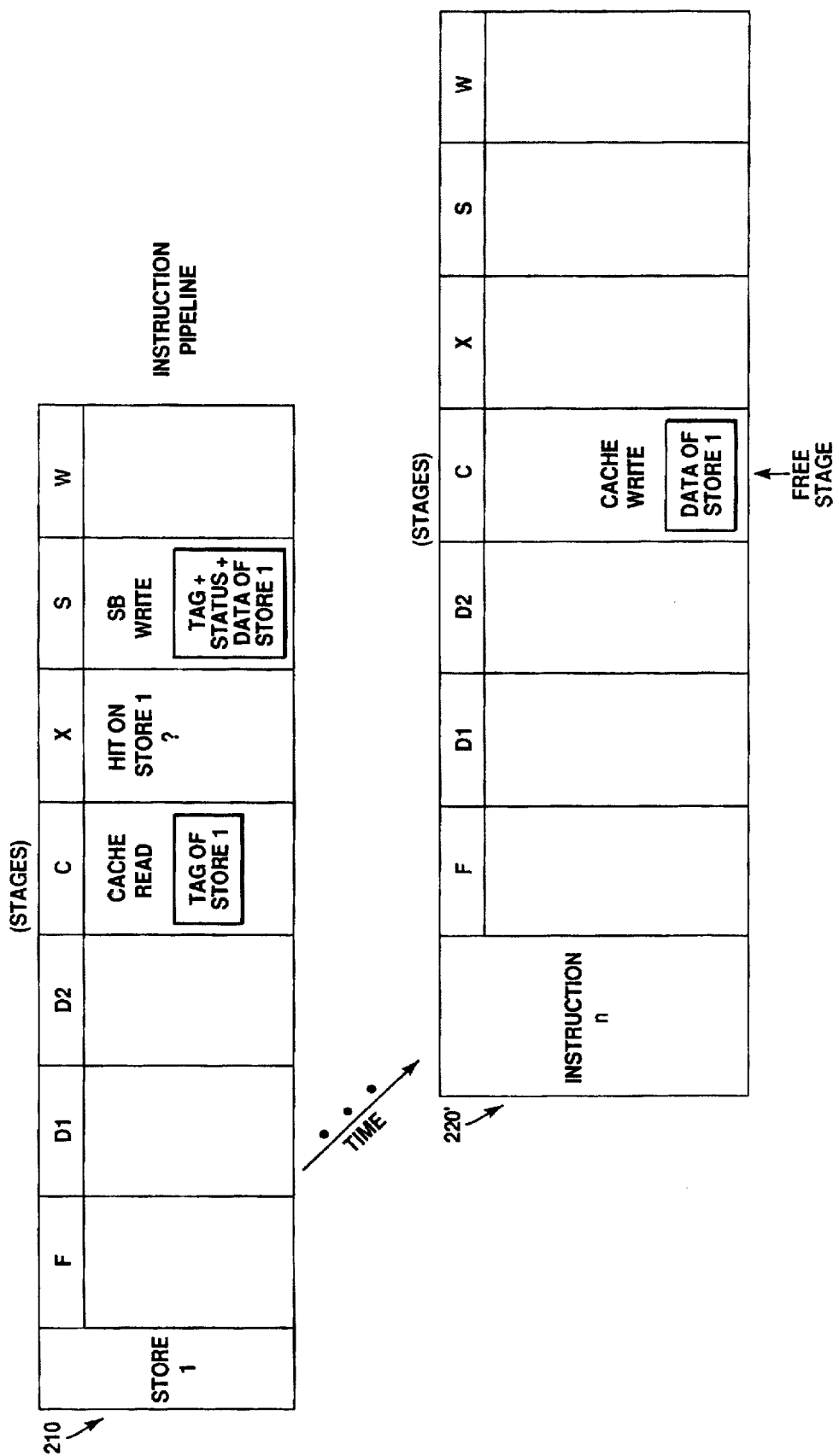
FIG. 2C is a pipeline chart and illustrates the novel delayed store mechanism of the present invention utilizing a free C stage of a subsequent instruction that does not write to the cache.

Although FIG. 2A and FIG. 2B illustrate use of a C stage of a subsequent store instruction (e.g., store n and store n+1) in which to store data of the delayed cache write operation, the present invention delayed store mechanism may utilize the C stage of any subsequent instruction that does not access the cache data portion during its C stage or when there is no instruction present in the C stage. Accordingly, subsequent store instructions are not the only instructions known to have a free C stage wherein no cache write operation occurs. FIG. 2C illustrates the embodiment of the present invention that delays the cache write operation of the store 1 instruction until a subsequent instruction that has a free C stage that does not involve a cache write operation. The subsequent instruction may be any instruction with such a free cache access stage ("C stage"). Pipeline 220 illustrates the pipeline processing of instruction n that is subsequent to the store 1 instruction and that does not perform a cache write operation during its C stage. Therefore, as shown, the data of store 1 that was delayed is written from the store buffer into the cache at this point.

It is appreciated that a free C stage may also become available, within the scope of the present invention, when there is no instruction present. If there is no instruction present, the delayed store information (of a previous store) may be written to the cache during this C stage.

Figure 3:
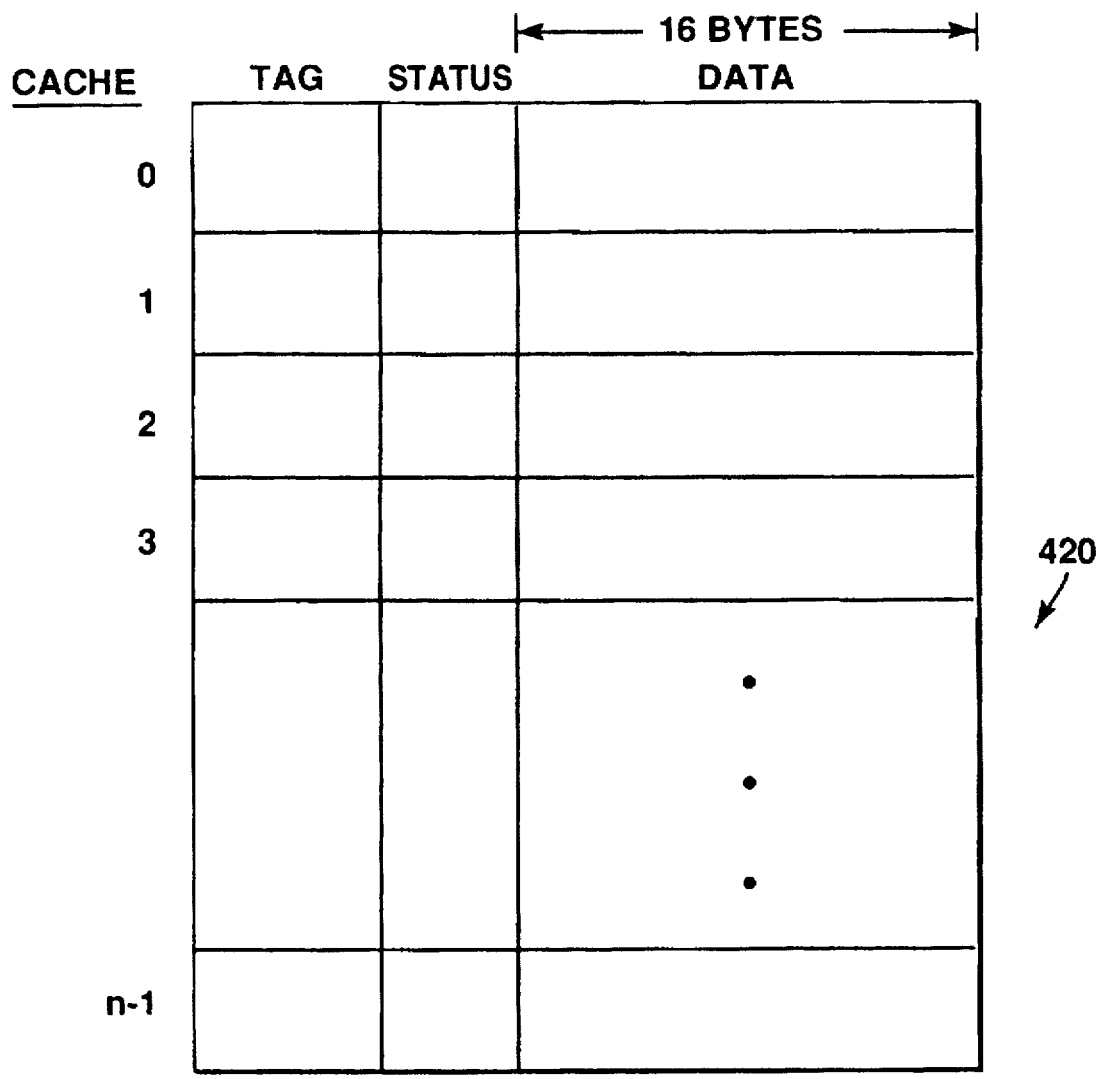
FIG. 3 illustrates the logical structure of the cache of the present invention.

FIG. 3 illustrates the logical structure of the cache 420 used in the present invention. The cache used in the present invention may be implemented using any number of well known cache configurations such as write-through, write-back, allocate and non-allocate, for instance. Any of the well known cache configurations can be equally well utilized within the scope of the present invention provided they contain separate decoder functions (one for the data section and one for the tag section) as described with reference to FIG. 6. The cache 420 of FIG. 3 is configured with n entries. Each entry has an associated tag, status and data field. The data field may be of any arbitrary size, however, typical sizes of 4, 16, 32 and 64 bytes per entry bytes may be used. As illustrated in FIG. 3 the data field consists of 16 bytes. The tag normally represents the high order bits of the first memory address of the 16 byte line of data. In the configuration of FIG. 3, data retrieved from an alternate memory source (e.g., a memory source apart from the cache 420) is placed into a cache entry as a line of 16 bytes. Cache block size and transfer size is 16 bytes in length but can be adjusted to a variety of lengths. Data similarly written from cache 420 to an alternate memory is transferred in blocks of 16 bytes.

If a tag associated with a given memory location is located in the tag field of the cache 420, and the tag is valid, then the data for that given memory location will be located in the data portion of the matching cache entry. If, for a given instruction, there is a cache miss then the tag associated with the instruction is not located within the tag fields of the cache 420. Then, the present invention must access the desired memory location from the alternate memory (which may be a series of other cache levels and eventually includes the main memory).

Figure 4:
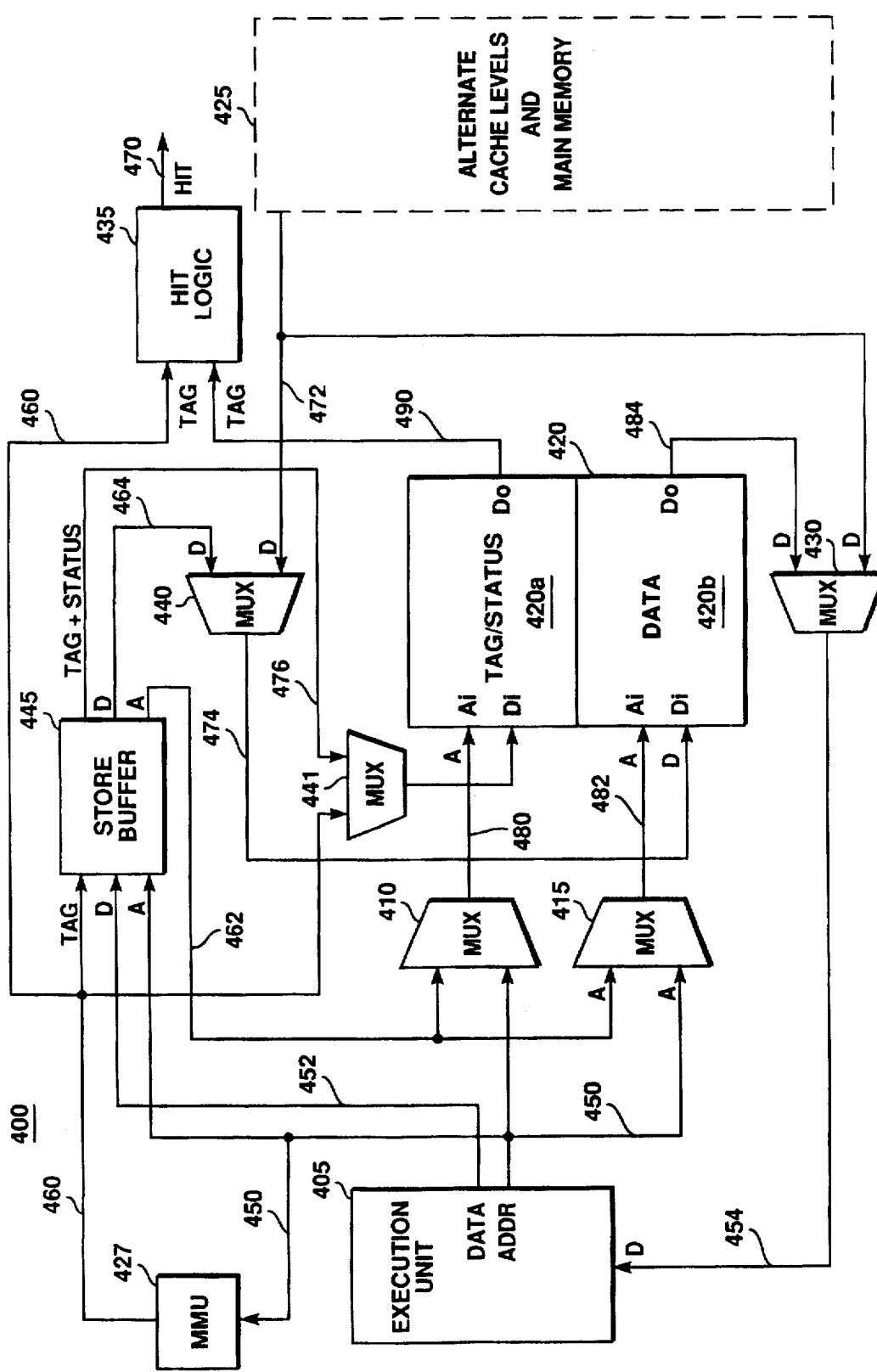
FIG. 4 is a block diagram of the circuitry and logic utilized by the present invention to provide the novel delayed store mechanism of the present invention.

FIG. 4 illustrates a block diagram of the circuit implementation 400 of the preferred embodiment of the present invention. The circuit 400 comprises all elements of FIG. 4 except for the alternate cache and main memory block 425 which may be external to block 400 in the preferred embodiment. A cache unit 420 is divided into two sections. Section 420a contains the tag and status field information and section 420a contains the data field information. The cache 420 of the present invention is separated into two different sections such that during a C stage the tag section, 420a, may be read by a first store instruction while the data section, 420b, may be simultaneously written to by a second and subsequent store instruction. Each section 420a and 420b has separate address decoders receiving addresses individually from address buses 480 and 482.

An execution unit 405 is coupled such that it supplies data via bus 452 to a store buffer 445. The execution unit 405 also supplies address signals via bus 450 to one input of a multiplexer ("mux") 410 and also to the input of mux 415. The execution unit 405 also provides an address signal via bus 450 to the input of the store buffer 445. The address signal over bus 450 is also routed to a Memory Management Unit (MMU) 427 which translates the address on bus 450 into a tag and status value and supplies them via bus 460 to the store buffer 445. The store buffer 445, which may be of a variety of conventional and well known configurations is implemented as a FIFO circuit of the preferred embodiment of the present invention. The address output of the store buffer 445 is sent over bus 462 to the inputs of both mux 410 and 415. The output of mux 410 is fed over bus 480 into the address input of tag section 420a of cache 420. The output of mux 415 is fed over bus 482 into the address input of data section 420b of cache 420.

The data input bus 476 of FIG. 4 originates from the tag and status signal output from the store buffer 445 and is input into one input of mux 441. The output of mux 441 is fed into the data input of cache tag section 420a. The other input of mux 441 originates from bus 460 and this is the load fill path. The data input bus 474 of the cache data section 420b originates from the output of mux 440. Mux 440 selects between the data output from the store buffer 445 over bus 464 and the data returned over bus 472 from the alternate and main memory block 425. The data output from the cache 420a is fed over bus 490 to the input of a hit logic block 435. The data output of data section 420b is fed over bus 484 into the first input of mux 430. The other input of mux 430 is from bus 472 which represents data returned from the alternate and main memory block 425. The output of mux 430 is fed to the data input bus 454 of the execution unit 405. Also fed to the hit logic 435 is bus 460 which carries the current tag information from MMU 427. The output of the hit determination logic 435 is fed over bus 470 which may be fed back to the execution unit 405.

It is appreciated that the store buffer 445 utilized within the present invention, except to the extent described as different, may be of a conventional design. The signal communication interface ("handshake") between the store buffer 445 and the execution unit 405 of circuit 400 may be implemented under a number of well known protocols. Therefore, this handshake is not illustrated or described in detail herein. It is appreciated, however, that in the preferred embodiment a number of control signals for address and data transfer exist between the execution unit 405 and the store buffer 445.

The multiplexers of FIG. 4 serve to channel the pertinent address and data lines between the elements of the circuit 400. Mux 410 and mux 415 serve to select the address accessing of section 420a and section 420b of the cache between (1) the store buffer and (2) the execution unit. Mux 440, in one embodiment of the present invention, serves to provide merging functions between the data bus 472 (which returns data lines from the alternate memory source 425) and the data bus 464 which originates from the store buffer 445. The mux 441 selects tag/status information from load miss or from the store buffer 445. Mux 430 acts to channel data to the execution unit that is output from the data cache 420b or returns from the alternate memory 425, such as for a load miss. It is appreciated that given the criteria of the bus selections for each mux, as described herein, well known methods and mechanisms can be utilized to realize the control logic for generating the required select signals for each mux. Therefore, such circuitry is not disclosed in detail herein as to not unnecessarily obscure aspects of the present invention.

The operation of the circuit of FIG. 4 will be explained with reference to the example of FIG. 2A and FIG. 2B and the exemplary pipeline structures. Refer to the pipeline 220 processing for store n. After the F, D1 and D2 stages, during stage C, the cache segment 420a is addressed by the execution unit so that the tag information for store n can be read. Mux 410 selects the address bus 450. The tags are output over bus 490 to hit determination logic 435 which also receives the current tag of store n from MMU 427 over bus 460. Simultaneously, the data section 420b of the cache is addressed by the store buffer 445, via mux 415, so that the data from the previous store, store 1, can be written into section 420b at the entry associated with the address of the matching tag for store 1 (e.g., for memory location assuming a tag match). Also mux 440 selects data bus 464. It is appreciated that if the previous store instruction (here store 1) generated a cache hit then there is no need to write the tag associated with memory y into cache 420a because that tag is already present. Therefore, the present invention avoids this write operation.

At stage X of pipeline 220, the tag information output by the cache 420 are compared against the tag associated with the memory location (z) of store n over bus 460. It is appreciated that the hit determination logic 435 may be implemented in hardware with comparators or may also be implemented in software and carried out within the execution unit 454 in alternative embodiments of the present invention. A number of well known methods and/or mechanisms may be utilized by the present invention to realize hit logic circuitry 435. If there is a cache hit for memory location z, then a signal over bus 470 will be asserted. At stage S, the execution unit 405 loads the tag, (and cache address of the matching cache entry if a tag hit occurred), and status, and data of store n into the store buffer 445 using data bus 452, address bus 450 and tag bus 460.

It is appreciated that when the execution unit 405 controls a cache data write operation, the mux 415 selects bus 450. It is further appreciated that when the store buffer 445 controls a cache tag write, mux 410 selects address bus 462.

Once stored in the store buffer 445, when the data associated with the store n reaches the front of the store buffer, the store buffer waits until a C stage of a subsequent instruction, for example, the C stage of a subsequent store (which in this example is store n+1). Or, alternatively, the present invention may wait until a free C stage of any another instruction or a C stage when no instruction is present. At this time, the store buffer 445 writes the data associated with store n into the cache segment 420b. The store buffer addresses the cache 420b using the cache address of the cache entry that matched the store n data from the hit logic 435. As discussed above, since there was a cache hit, there is no need for the present invention to write the tag (associated with the store n) into the cache 420. While the above occurs, the present invention at the C stage of store n+1 also reads cache 420a for the tag information. The pertinent data for store n+1 is then loaded into the store buffer 445 at stage S.

Refer still to FIG. 4. Upon a cache miss at stage X, the present invention requests the pertinent line of data from the alternate cache and main memory block 425. If the cache determination for store n (performed at stage X) results in a cache miss, then at stage S the tag, status and data associated with the store n are loaded into the store buffer 445. At this time, the store buffer requests from block 425 that the line of memory associated with the tag of store n be returned. By the time the data associated with the store n reaches the front of the FIFO of the store buffer, the requested line of data will return from block 425. If not, the store at the head of the store buffer waits for the arrival of the missed data. It is appreciated that for a cache miss, the present invention writes information associated with outstanding stores into the store buffer 445.

As the data returns over bus 472 different embodiments of the present invention may perform one of two functions. First, the returning data over bus 472 may be merged with the write data of the store n. This merging may occur via store buffer 445, or some other temporary storage memory, in which the returning line of data over bus 472 would be merged with the data of store n over bus 464. Once merged, the present invention will wait until some cache access stage (C) when the cache 420 is not being accessed. At this free stage C, the present invention will cause the store buffer to write the merged data and the tag into the cache segments 420a and 420b. The muxes 410 and 415 will be selected accordingly to select the address bus 462 and the data bus 474. Second, in the alternative, the present invention may not utilize the merge function. Rather, the present invention waits until the free C stage as discussed above, but writes the returning data over line 472 directly into the cache and then overwrites that data, in the appropriate locations, with the data of the store n. Both of the above embodiments of the present invention arrive at the same result.

It is appreciated that upon a cache miss, the present invention may not utilize a C stage of a subsequent store to perform the desired write function because upon a cache miss, the present invention must write both the tag and the data of the store n. Since the C stage of a subsequent store performs a tag read for that subsequent store, the present invention is not able to also simultaneously perform a tag write of the previous store.

For instance, assume that during pipeline 220, at stage X, the tag hit determination 435 results in a cache miss for the tag associated with the store n. The present invention stores the tag, the data and the status associated with store n into the store buffer 445. Assume that after requesting the line from main memory 425 the data returns and is merged at store buffer 445 with the data. Once the data, status and tag associated with the store n reach the front of the FIFO of the store buffer 445, the present waits until a free C stage in which to store the tag and data into the cache 420 for store n. Assume also that the store n+1 pipeline 230 is now being processed by the processor of the present invention. The present invention is not able to utilize the C stage of the pipeline 230 in which to write the store n tag and data because the present invention needs to read the tag information associated with the store n+1 during this C stage. In other words, since the cache segment 420a is being used to perform the tag read operation for the store n+1, it cannot also be used, simultaneously, to perform the tag write operation for the tag of the store n.

Therefore, upon a cache miss for a given store instruction, the present invention must (1) wait until a free cache access stage (e.g., stage C) occurs in which to perform the tag/data write or (2) must stall the processor to get a free C stage in which to perform the tag/data write for the given store instruction. However, in this case the present invention may not utilize the C stage of a subsequent store.

Operational Flow

Figure 5:
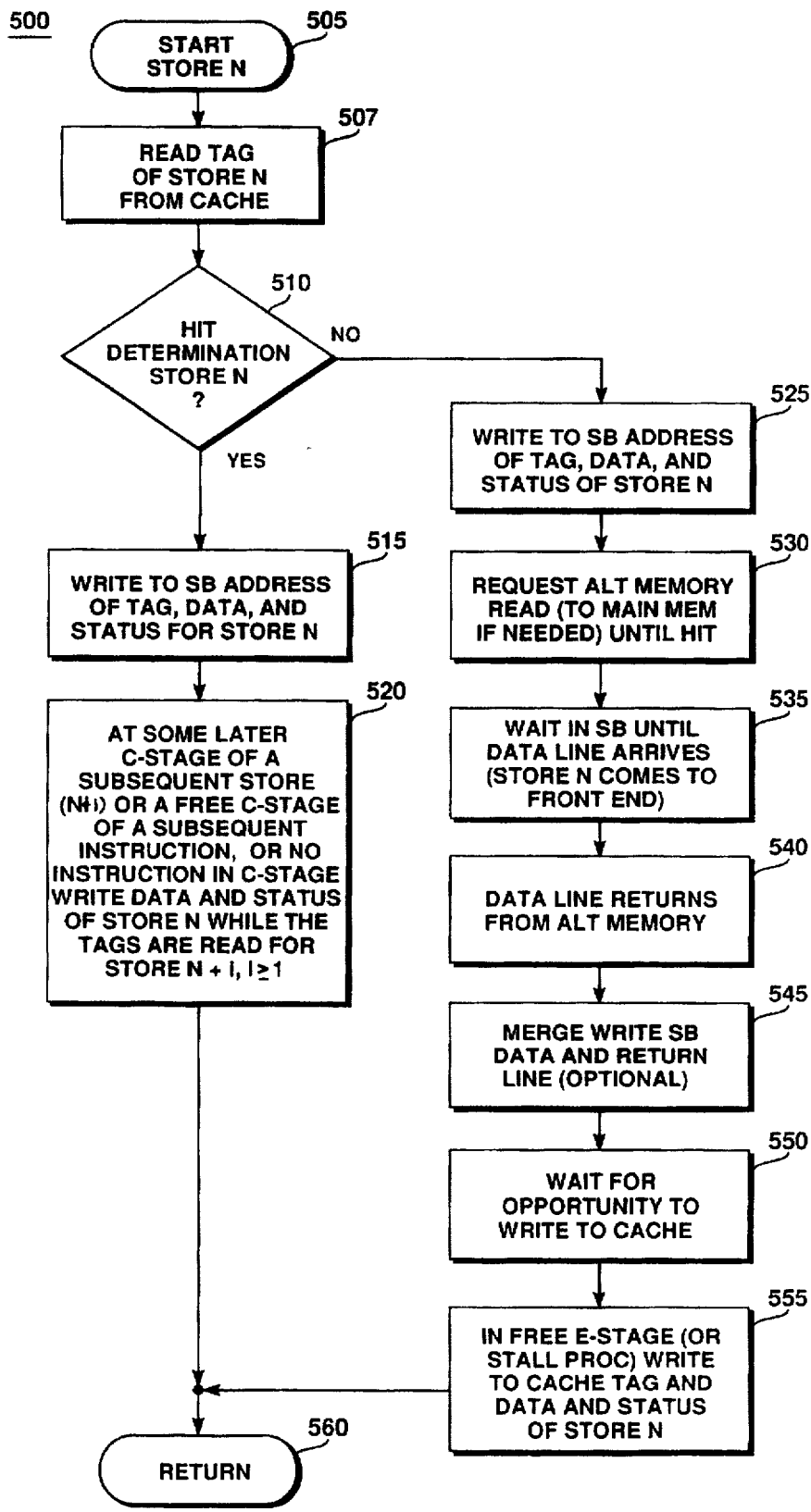
FIG. 5 is a flow diagram illustrating major processing blocks of the present invention delayed store mechanism.

The operational flow 500, including major processing tasks of the preferred embodiment of the present invention, is illustrated with reference to FIG. 5. The processing flow 500 is illustrated for those tasks that relate to processing the store information associated with store n of FIG. 2A and FIG. 2B. Flow 500 begins at block 505 (where store n is fetched and decoded and any required address generation tasks are performed) and flows to tag read block 507. At block 507 (which is stage C of the exemplary pipeline format 220), the present invention will perform a cache read of cache section 420a to read tag information stored in the cache 420a for a tag determination for store n. It is appreciated that at block 507, the present invention may also perform, if required, a data write into cache section 420b; this data write operation would correspond to a previous store instruction (such as store 1 instruction).

At block 510 (corresponding to stage X of the exemplary pipeline format 220), the present invention via circuit 435 determines if the tag associated with memory location z (of store n) is present within the valid tag information currently stored in the cache 420a. If a cache hit occurs, then the tag associated with memory location z is present within the matching entry of cache 420a (signal 470 becomes active) and block 515 is entered. At block 515 (stage S of the exemplary pipeline 220), the present invention stores into the store buffer 445 the following information: the translated cache address of the matching cache entry, the data and status information pertaining to store n. In the preferred embodiment, upon a cache hit the tag value itself for store n is stored in the store buffer 445 (but alternatively it may not be stored). The present invention then flows to block 520. At block 520, the present invention waits until the C stage of a subsequent instruction that does not perform a cache write operation or that does not access the cache at all or if no instruction is present in that stage. In one embodiment, this instruction can be a subsequent store instruction (in the present example it is store n+1 but could also be n+1, where i is greater than or equal to 1). Alternatively, the present invention may wait for any clock cycle that does not utilize the cache. Any of the above may cause a free C stage to become available.

Assuming the free C stage is provided by a subsequent instruction that does not access the cache, during this free C stage (also called the cache access stage) the present invention will cause the store buffer to write the data associated with the store n instruction into cache 420b at the same time that the tag information is read from cache 420a for the subsequent instruction that does not write to the cache during its C stage. In this example the subsequent store instruction is store n+1. To store the write data, the present invention sends the address of the matching entry (from the store buffer 445) over bus 462 and sends the data associated with store n over bus 464. Mux 440 is set to select bus 464 and mux 415 is set to select bus 462.

In the preferred embodiment of the present invention, during the simultaneous read operation of the tag information for the store n+1 instruction is accessed since mux 410 selects address bus 450 which is controlled by the execution unit. The data output from bus 490 is fed to the tag match logic 435. In an alternative embodiment of the present invention, the data bus output 490 may be fed back into the execution unit 405 and the match determination may be performed there. The processing 500 of the present invention, as pertinent to the store n instruction, then flows to block 560.

It is appreciated that the above flow processing (associated with blocks 510, 515, and 520) does not perform a write operation into the tag portion of the cache 420a. This is the case because if block 510 indicates that a cache hit occurred, the tag is already present in cache 420a and there is no need to "rewrite" the tag. The present invention advantageously takes advantage of this fact in the delayed store mechanism.

It is further appreciated that in an alternative embodiment of the present invention, the data that is written to the store buffer 445 at block 515 does not have to completely written during stage X. Rather, some of this information may be written ahead of time, e.g., before stage X and some of the data may be written after stage X. The same is true regarding block 525, which will be discussed to follow.

If the cache hit determination logic 435 indicates that a hit has not occurred, then the present invention flows from block 510 to block 525. At block 525 (corresponding to stage S of exemplary pipeline 220), the present invention stores the tag, status and data associated with store n into the store buffer 445. At block 530, the present invention generates a request to the alternate cache and main memory unit 425 for the line of data corresponding to memory location z. At this point, the processor is free to continue processing subsequent instructions and is not stalled. The request made at block 530 may be performed by any of a number of well known techniques within the scope of the present invention for requesting data from alternative memory sources upon a cache miss condition.

At block 535, the present invention will transfer the data associated with the store n instruction up to the front of the store buffer 445 in normal course during the delay between the request for the data of block 530 and when that data line returns over bus 472. At block 540, the requested data returns from block 425 over bus 472. At this point the present invention may perform a number of different operations. In the preferred embodiment at block 545, the data over bus 472 (typically 16 bytes) is merged with the data corresponding to store n which is output over bus 464. The lower bits of the tag associated with store n may be used to control mux 440 during the merging operation so that the data of store n is merged into the proper byte locations of the data returned over bus 472. Merged data is stored in the store buffer 445 if not immediately written to the cache.

In the preferred embodiment after the data is merged, at block 550 the present invention waits for an instruction that does not require a cache access during the C stage of the exemplary pipeline format or no instruction in the C stage. At block 550 the present invention may also stall the processor in order to get the required cache access time. During this "free" C stage, the present invention, at block 555 will write the data of store n into the newly allocated cache entry of the cache 420b and will simultaneously write the tag of store n into this same entry of the cache 420a. Then, the processes flows to block 560.

It is appreciated that since there was a cache miss at block 510, the present invention must write the new tag of store n into the allocated entry of the cache 420a. For this reason, the present invention may not use a C stage of a subsequent store instruction for the write operation of block 555 if there was a cache miss. This is the case because the present invention may not read and write to the cache 420a at the same instance since the cache 420a is a single ported cache. A single ported cache is adopted here because it is faster, uses less complex hardware and is easier to fabricate.

Alternatively, in lieu of performing the merge operation of block 545, the present invention may, upon locating a free C stage, write the data from bus 472 into an allocated cache entry and then immediately thereafter overwrite with the cache and tag data of the store n instruction. Although not the preferred method, this alternative embodiment will arrive at similar results.

The preferred embodiment of the present invention also includes a step of snooping the store buffer 445 regarding load instructions. Since store information is placed into the store buffer 445 before it is placed into the cache 420, and further since store instructions may be executed out-of-order within the scope of the present invention, there is the possibility that a load instruction that normally would follow a given store instruction is dependent on the data associated with the given store instruction that: (1) has been placed into the store buffer 445; but (2) has not yet been updated into the cache 420. In this case, if the load instruction merely searched the cache 420 for this memory location it would generate a cache miss and further the alternate and main memory 425 would not contain the data because the store buffer 445 contains the information.

Therefore, the present invention provides that for a given load instruction, during the cache tag read operation (stage C), not only is the cache 420 read in order to locate a match, but the store buffer is also simultaneously read (e.g., "snooped") to determine if a pending store instruction contains the information required for the load. The store buffer snoop operation of the preferred embodiment of the present invention occurs during stage C of the exemplary pipeline stage format for a load instruction.

For instance, assuming the store n instruction is pending in the store buffer 445 and a load instruction requires the data for memory location z. Although the load's tag read operation might generate a cache hit on location z, the data is still in the store buffer 445. Therefore, simultaneous with the cache tag read operation of the load instruction, the store buffer 445 is snooped in order to locate memory z. Several outcomes may occur as a result of the snoop operation. First, if the load data is not located in the cache 420, but it is located in the store buffer 445, then the store buffer will supply the data. Second, if the load data is found in the cache 420 but not located in the store buffer 445, then the cache 420 supplies the data. Third, if the load data is found in both the cache 420 and the store buffer 445, then the data in the store buffer supersedes the data of the cache 420. Finally, if not found in cache nor in the store buffer, the data is located from the alternate memory. In such a way, the present invention provides a mechanism and method for insuring data integrity within out-of-order store execution capabilities.

Figure 6:
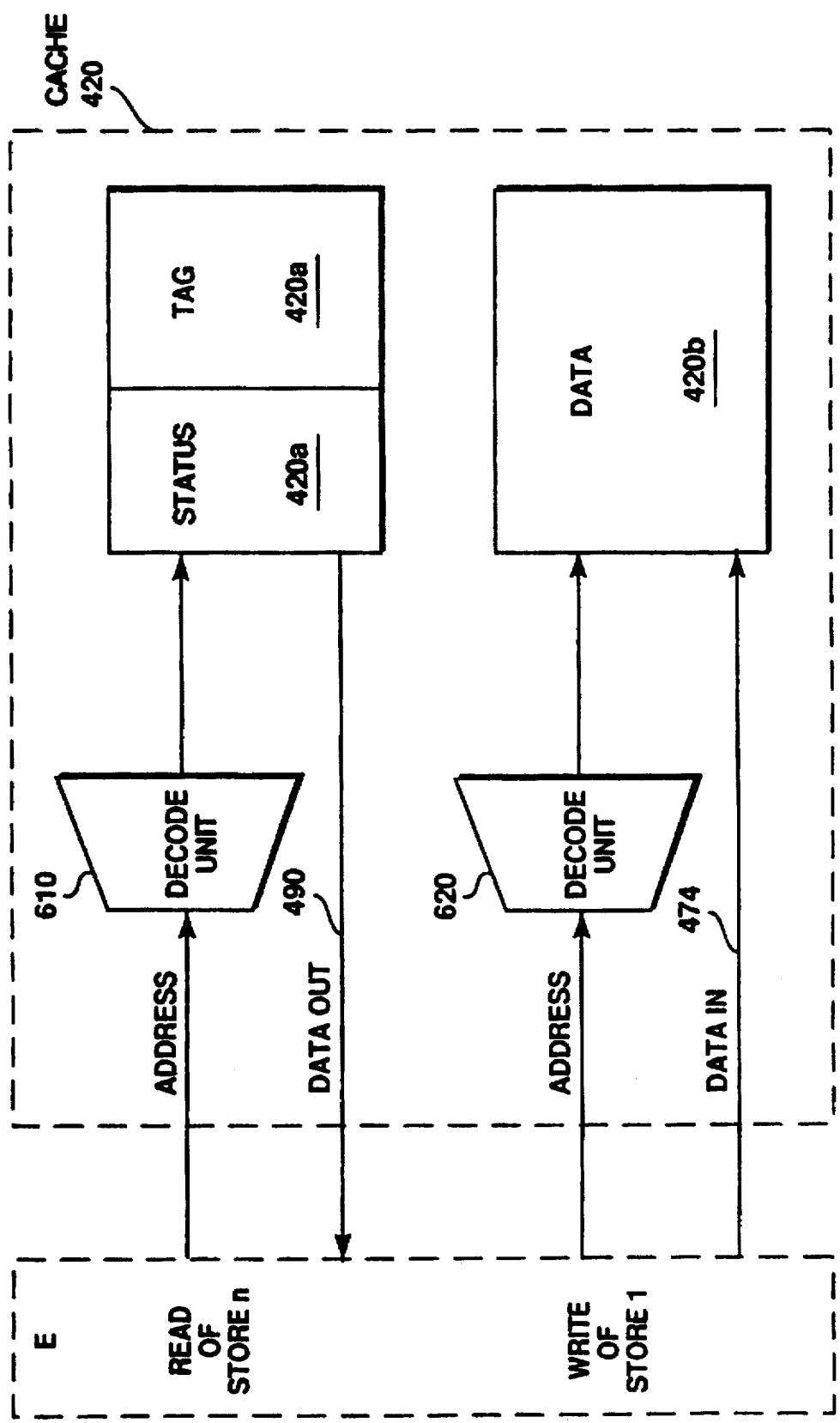
FIG. 6 illustrates a specialized cache structure utilized by the present invention which contains separate address decoding for the data information and for the tag information of the cache.

Refer to FIG. 6 which illustrates the cache design adopted by the present invention. It is appreciated that to the extent a cache adopts the following special features of the present invention, any of the well known cache designs and techniques may be used within the scope of the present invention as cache 420 for the remainder features. Reference to the processing of tag information into and out of the cache 420 may be assumed to include the status information for a given cache entry.

The cache 420 of the present invention must have a separate decoder for the data portion 420b and for the tag portion 420a. As shown in FIG. 6, decode unit 610 is used for addressing the tag portion 420a and decode unit 620 is utilized by the present invention for decoding the data portion 420b. Two decoders are required of the cache 420 of the present invention because a tag read operation and a data write operation must be allowed to occur simultaneously. Each portion 420a and 420b is composed of single ported memories. FIG. 6 illustrates the operation of the cache 420 during a typical C stage of the exemplary pipeline format when both a read and write operation are performed.

As shown, during a C stage (a cache access stage), a read of the store n instruction utilizes decode unit 610 and for tag information for the store n instruction is supplied over bus 490. Also during the same C stage, the decode unit 620 is accessed and data for the store 1 instruction (the previous store) is input to portion 420b over bus 474. This example assumes a tag match for the store 1 instruction.

Microprocessor

Figure 7:
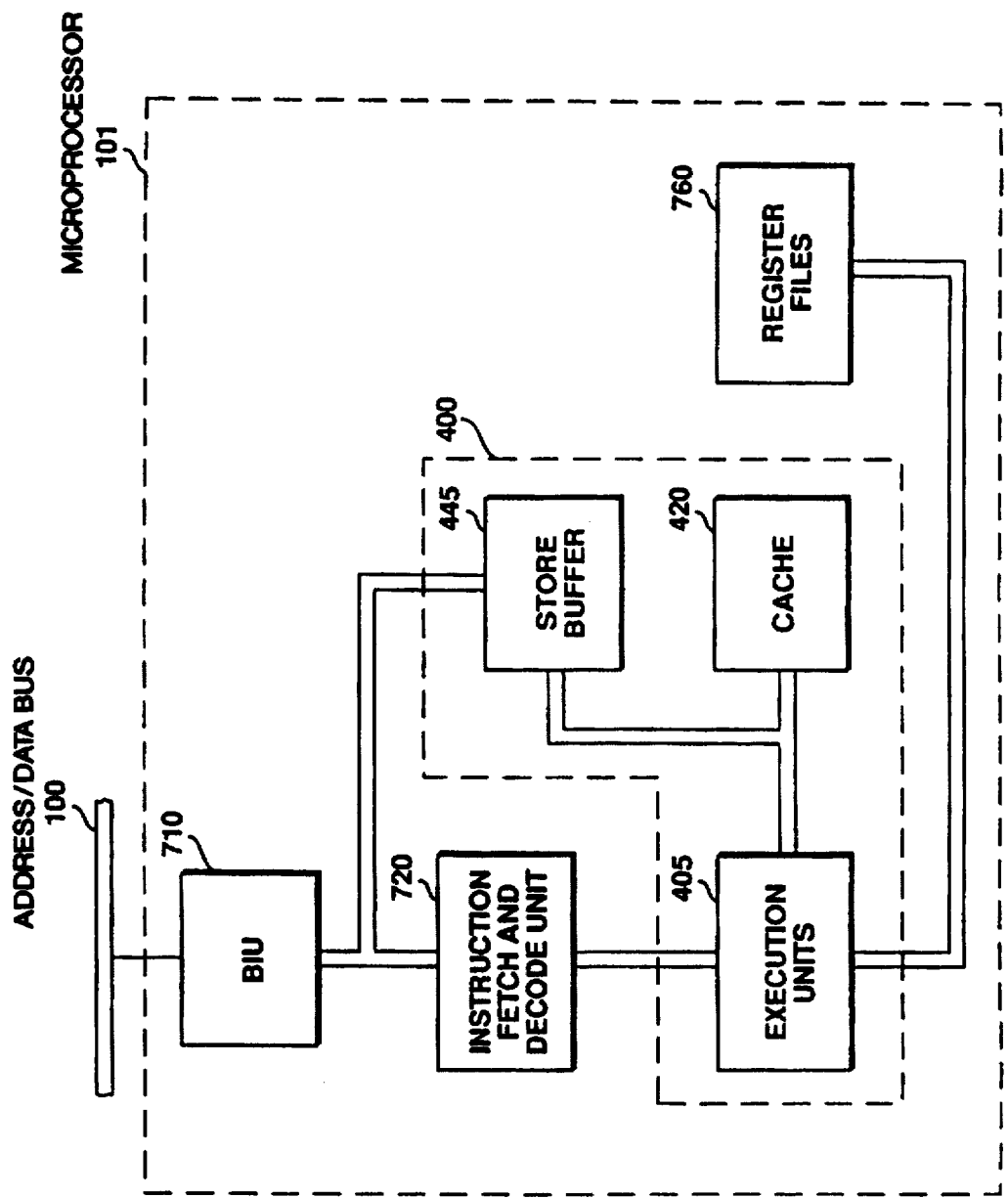
FIG. 7 is a functional block diagram of an improved pipeline processor of the present invention implemented to operate the delayed store mechanism of the present invention.

As previously described above, the delayed store mechanism of the present invention may be implemented in a pipeline microprocessor which may also be superscalar and/or super pipelined. This microprocessor 101 of the present invention is illustrated in FIG. 7. By providing a single cache access stage for both load and store instructions, a more uniform and efficient pipeline format may be adopted within the high performance microprocessor 101. It is appreciated that the present invention mechanism for the delayed store instruction may operate advantageously within a number of well known microprocessor architectures. Therefore, the present invention should not be considered limited to a particular microprocessor architecture as a result of the following discussion.

FIG. 7 illustrates major component blocks of the microprocessor 101 of the present invention. Instructions to be executed and data for processing are supplied (via a RAM and ROM of FIG. 8) over address/data bus 100 to a bus interface unit or BIU 710 which may or may not contain an instruction cache unit. Instructions are fed from the bus 100 to the fetch and decode unit 720 which fetches the instructions from external memory and decodes the instructions. If the microprocessor is superscalar then several instructions may be processed simultaneously. Also coupled to the fetch and decode unit 720 is one or more execution units 405 which perform logical and arithmetic instructions as well as other well known execution functions. The execution unit 405 may be capable of performing both integer and floating point instructions and will contain one or more ALUs (arithmetic logic units) as well as other units specially designed for arithmetic and logical functions. The sources and results of the execution unit may include memory locations and also registers which reside in a register file 760. Therefore, the register file 760 is coupled to the execution unit 405. The register file 760 may contain multiple registers for storage of both floating point and integer information.

The execution unit 405 of FIG. 7 is also coupled to cache unit 420. The execution unit is also coupled to a store buffer 445. The store buffer 445 is coupled to the cache 420 as shown. The store buffer 445 may be of any of the well known conventions, for example the store buffer 445 may be implemented as a FIFO structure. Elements of the present invention associated with circuit 400 as described above would operate in their expected course (as discussed above) within the microprocessor 101 of the present invention and therefore these operations are not reiterated again herein. It is appreciated that all elements of circuit 400 (as shown in detail in FIG. 4) are present within the processor 101 of FIG. 7.

It is further appreciated that while shown as integrated within processor 101, one or more components of the store buffer 445, cache 420 and other elements of circuit 400 (except for execution unit 405) may be contained outside and peripheral to the processor 101, such as associated on a separate chip or on separate chips. Such alternate placement would be one of design choice and such implementations would be considered fully within the scope of the present invention.

Computer System

The high performance pipeline microprocessor 101 of the present invention may be added to a general purpose computer system in order to increase processing speed of the computer system. Generally, the computer system 112 of the present invention of FIG. 8 comprises the address/data bus 100 for communicating information, the central processor 101 (as discussed above) coupled with the bus 100 for processing information and command instructions, a random access memory 102 coupled with bus 100 for storing information and instructions for the central processor 101, a read only memory 103 coupled with bus 100 for storing static information and command instructions for the processor 101. Also available for interface with the computer system 112 of the present invention is a data storage device 104 such as a magnetic disk or optical disk drive which may be communicatively coupled with the bus 100 for storing information and command instructions.

The display device 105 utilized with the computer system of the present invention may be a liquid crystal device, cathode ray tube, or other display device suitable for creating graphic images and alphanumeric characters recognizable to the user. The computer system 112 may also contain an alphanumeric input device 106 including alphanumeric and function keys coupled to the bus 100 for communicating information and command selections to the central processor 101, a cursor control device 107 coupled to the bus for communicating user input, information and command selections to the central processor 101 based on a user's hand movement. Many implementations of the cursor control device are known in the art including a trackball, mouse, joystick or special keys on the alphanumeric input device 105 capable of signaling movement of a given direction or manner of displacement.

The computer system 112 also contains an input and output device 108 coupled to the bus 100 for communicating information to and from the computer system. The communication device 108 may be composed of a serial or parallel communication port or may be a communication modem. It is appreciated that such communication device 108 may provide an interface between the bus 100 and the user interface devices (keyboard 106, cursor 107, display 105) of the computer system. In this case, the user interface devices will reside within a terminal device this is coupled to the communication device 108 so that the processor 101, the RAM 102, the ROM 103 and the storage device 104 may communicate to the terminal and vice-versa. Components 101, 102, 103, 104, may be implemented on a single board or computer chassis 65 which is then coupled, via bus 100, the other components of the computer system, such as units 105, 106, 107 and 108.

The preferred embodiment of the present invention, a mechanism and method for implementing a uniform pipeline format using a delayed store mechanism, is thus described. It is appreciated that the delayed store mechanism provides additional advantages aside from providing a uniform and efficient pipeline format for the microprocessor instructions. While the present invention has been described in particular embodiments, it should be appreciated that the present invention should not be construed as limited by such embodiments, but rather construed according to the below claims.

What is claimed is:

1. An apparatus for performing pipeline store instructions utilizing a single cache access pipestage, said apparatus comprising:

a cache unit for storing data information and tag information;

pipeline processing circuitry for processing a current instruction, said pipeline processing circuitry including a cache access instruction stage of said current instruction, wherein said current instruction is free to access tag information of said cache unit related to said current instruction independent of any access to data information of said cache unit related to said current instruction; and write logic for performing a data write operation for data information of a previous store instruction, said data write operation for writing said data information to said cache unit during said cache access instruction stage of said current instruction.

2. The apparatus for performing store instructions as described in claim 1 wherein said current instruction is a current store instruction and wherein said pipeline processing circuitry comprises read logic for performing a tag read operation for tag information of said current store instruction, said tag read operation reading said tag information from said cache unit during said cache access instruction stage.

3. The apparatus for performing store instructions as described in claim 2 wherein said read logic and said write logic operate simultaneously.

4. The apparatus for performing store instructions as described in claim 2 further comprising hit determination means for determining if said tag information of said current store instruction is located within said cache unit.

5. The apparatus for performing store instructions as described in claim 4 further comprising:
   an alternate memory source; and
   request means for requesting that memory information of said tag information be returned from said alternate memory source if said hit determination means determines that said tag information is not located within said cache unit.

6. The apparatus for performing store instructions as described in claim 2 wherein said cache unit comprises:
   a first memory portion having a first decoder for addressing said first memory portion, wherein said first memory portion is for containing said tag information; and
   a second memory portion having a second decoder for addressing said second memory portion, wherein said second memory portion is for containing said data information, and wherein said first memory portion is addressing to supply tag information of said current store instruction and said second memory portion is simultaneously accessible to receive data information of said previous store instruction.

7. The apparatus for performing store instructions as described in claim 1 wherein said write logic further comprises a store buffer and wherein said data information of said previous store instruction is transferred from said store buffer to said cache unit during said cache access instruction stage of said current instruction.

8. The apparatus for performing store instructions as described in claim 1 wherein said cache unit comprises:
   a first memory portion having a first decoder for addressing said first memory portion, wherein said first memory portion is for containing said tag information; and
   a second memory portion having a second decoder for addressing said second memory portion, wherein said second memory portion is for containing said data information.

9. An apparatus for performing a pipeline store instruction requiring a single cache access pipestage, said apparatus comprising:
   a cache unit for storing data information and tag information;
   pipeline processing circuitry for processing a store instruction, said pipeline processing circuitry for performing a tag read during a single cache access pipestage of an instruction pipeline of said store instruction;
   store logic for writing data information of said store instruction into a store buffer for temporarily buffering said data information; and
   write logic for performing a data write operation for said data information of said store instruction, said data write operation for writing said data information to said cache unit within a clock cycle wherein said data information of said cache unit is not otherwise accessed.

10. The apparatus for performing a pipeline store instruction as described in claim 9 wherein said cache unit comprises:
    a first memory portion having a first decoder for addressing said first memory portion, wherein said first memory portion is for containing said tag information; and
    a second memory portion having a second decoder for addressing said second memory portion, wherein said second memory portion is for containing said data information.

11. The apparatus for performing a pipeline store instruction as described in claim 9 wherein said clock cycle wherein said data information of said cache unit is not otherwise accessed is a free cache access pipestage of a subsequent instruction.

12. The apparatus for performing a pipeline store instruction as described in claim 11 wherein said subsequent instruction is a subsequent store instruction.

13. The apparatus for performing a pipeline store instruction as described in claim 9 wherein said write logic is coupled to said store buffer for obtaining said data information of said store instruction.

14. A pipeline processor for executing instructions and processing information, said processor comprising:
    bus interface unit for interfacing with an external address and data bus;
    fetch and decode unit coupled to said bus interface unit for fetching instructions from memory and decoding said instructions;
    execution unit coupled to said fetch and decode unit for executing said instructions;
    cache memory for storing data information and tag information; and
    a mechanism partially implemented within said execution unit for executing store instructions, said mechanism comprising:
       processing circuitry for processing a current instruction, said processing circuitry including an instruction stage of said current instruction wherein said current instruction is free to access tag information of said cache memory related to said current instruction independent of any access to data information of said cache memory related to said current instruction; and
       write logic for performing a data write operation for data information of a previous store instruction, said data write operation for writing said data information to said cache memory during said cache access instruction stage of said current instruction.

15. The pipeline processor as described in claim 14 wherein said current instruction is a store instruction and wherein said processing circuitry comprises read logic for performing a tag read operation for tag information of said current store instruction, said tag read operation reading said tag information from said cache memory during said instruction stage.

16. The pipeline processor as described in claim 15 wherein said read logic and said write logic operate simultaneously and wherein said instruction stage is a cache access stage of an instruction pipeline of said current instruction.

17. The pipeline processor as described in claim 15 further comprising hit determination means for determining if said tag information of said current store instruction is located within said cache memory;

an alternate memory source coupled to said processor; and request means for requesting that memory information of said tag information be returned from said alternate memory source if said hit determination means determines that said tag information is not located within said cache memory.

18. The pipeline processor as described in claim 15 wherein said cache memory comprises:

a first memory portion having a first decoder for addressing said first memory portion, wherein said first memory portion is for containing said tag information; and a second memory portion having a second decoder for addressing said second memory portion, wherein said second memory portion is for containing said data information, wherein said first memory portion is accessible to supply tag information of said current store instruction and said second memory portion is simultaneously accessible to receive data information of said previous store instruction.

19. The pipeline processor as described in claim 14 wherein said write logic further comprises a store buffer and wherein write logic is for writing said data information of said previous store instruction from said store buffer to said cache memory during said cache access stage of said current instruction.

20. A computer system comprising:

an address and data bus for coupling system components;

a display unit coupled to said bus for displaying information;

a user interface coupled to said bus for receiving information input from a user;

a memory storage unit coupled to said bus for storing instructions and data; and a processor for executing instructions and processing data, said processor comprising circuitry for executing store instructions, said circuitry comprising:

a cache memory for containing data information and tag information;

pipeline processing circuitry for processing a current instruction, said pipeline processing circuitry including an instruction stage of said current instruction wherein said current instruction is free to access tag information of said cache memory related to said current instruction independent of any access to data information of said cache memory related to said current instruction; and write logic for performing a data write operation for data information of a previous store instruction, said data write operation for writing said data information to said cache memory during said instruction stage.

21. The computer system as described in claim 20 wherein said current instruction is a current store instruction and wherein said pipeline processing circuitry comprises read logic for performing a tag read operation for tag information of said current store instruction, said tag read operation reading said tag information from said cache memory during said instruction stage.

22. The computer system as described in claim 21 wherein said read logic and said write logic operate simultaneously and wherein said instruction stage is a single cache access stage of an instruction pipeline and wherein said write logic further comprises a store buffer and wherein said write logic is also for writing said data information of said previous store instruction from said store buffer to said cache memory.

23. The computer system as described in claim 21 wherein said cache memory comprises:

a first memory portion having a first decoder for addressing said first memory portion, wherein said first memory portion for containing said tag information; and a second memory portion having a second decoder for addressing said second memory portion, wherein said second memory portion for containing said data information, wherein said first memory portion is accessible said read logic to supply tag information of said current store instruction and said second memory portion is simultaneously accessible by said write logic to receive data information of said previous store instruction.

24. In a pipeline processor having a cache memory, a method of executing a pipelined store instruction having a single cache access pipestage, said method comprising the steps of:

performing a tag read operation for tag information of a current store instruction, said tag read operation reading said tag information from said cache memory during a cache access stage of said current instruction;

temporarily storing data information of said current store instruction; and performing a data write operation during a subsequent cache access pipestage that is otherwise free of a cache access to data information of said cache memory, said data write operation writing said data information of said current store instruction to said cache memory.

25. The method of executing a store instruction as described in claim 24 wherein said subsequent cache access pipestage that is otherwise free of a cache access to data information of said cache memory is a cache access pipestage of a subsequent instruction.

26. The method of executing a store instruction as described in claim 25 wherein said subsequent instruction is a subsequent store instruction and further comprising the step of performing a tag read operation for tag information of said subsequent store operation during said subsequent cache access pipestage.

27. The method of executing a store instruction as described in claim 26 wherein said step of performing a tag read operation comprises the step of reading said tag information from a first memory portion of said cache memory, said first memory portion having a first decoder for addressing said first memory portion; and wherein said step of performing a data write operation further comprises the step of writing said data information into a second memory portion of said cache memory, said second memory portion having a second decoder for addressing said second memory portion.

28. The method of executing a store instruction as described in claim 25 wherein said step of temporarily storing data information of said current store instruction comprises the step of storing said data information into a store buffer and wherein said step of performing a data write operation comprises the step of transferring said data information of said current store instruction from said store buffer to said cache memory.

29. The method of executing a store instruction as described in claim 25 further comprising the step of determining if said tag information of said current store instruction is located within said cache memory.

30. The method of executing a store instruction as described in claim 29 further comprising the steps of:

providing information in an alternative memory source; and requesting that memory information of said tag information of said current store instruction be returned from said alternate memory source if said step of determining indicates that said tag information of said current store instruction is not located within said cache memory.

31. The method of executing a store instruction as described in claim 30 further comprising the step of storing said data of said current store instruction into said cache memory during a cache access pipestage of a subsequent instruction that does not read or write to said cache memory if said step of determining indicates that said tag information of said current store instruction is not within said cache memory.

32. The method of executing a store instruction as described in claim 30 wherein said step of storing said data of said current store instruction includes the step of merging said data information with said memory information returned from said alternate memory source.

* * * * *

UNITED STATES PATENT AND TRADEMARK OFFICE
CERTIFICATE OF CORRECTION

PATENT NO. : 5,717,896
DATED : February 10, 1998
INVENTOR(S) : Yung et al.

It is certified that error appears in the above-identified patent and that said Letters Patent is hereby corrected as shown below:

Title page,
Item [56], References Cited, Patent Number 5,297,281, please replace class/sub-class number "395/392" with -- 395/650 --.

Column 4,
Line 2, please insert -- of -- after "execution".

Column 17,
Line 35, please delete "addressing" and insert -- accessible --

Column 20,
Line 16, please insert -- by -- after "accessible".

Signed and Sealed this

Twenty-second Day of October, 2002

*Attest:*

JAMES E. ROGAN
*Attesting Officer*   *Director of the United States Patent and Trademark Office*